United States Patent
Oh et al.

(10) Patent No.: US 9,324,732 B2
(45) Date of Patent: Apr. 26, 2016

(54) THREE-DIMENSIONAL (3D) NON-VOLATILE MEMORY DEVICE

(71) Applicant: SK hynix Inc., Icheon (KR)

(72) Inventors: Sung Lae Oh, Cheongju (KR); Go Hyun Lee, Yongin (KR); Chang Man Son, Namyangju (KR); Soo Nam Jung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/615,368

(22) Filed: Feb. 5, 2015

(65) Prior Publication Data

US 2016/0020221 A1   Jan. 21, 2016

(30) Foreign Application Priority Data

Jul. 21, 2014   (KR) ........................ 10-2014-0092140

(51) Int. Cl.
| | | |
|---|---|---|
| *H01L 27/115* | (2006.01) | |
| *H01L 29/792* | (2006.01) | |
| *H01L 29/423* | (2006.01) | |
| *H01L 29/10* | (2006.01) | |

(52) U.S. Cl.
CPC ...... *H01L 27/11582* (2013.01); *H01L 29/1037* (2013.01); *H01L 29/4234* (2013.01); *H01L 29/792* (2013.01)

(58) Field of Classification Search
CPC .................................................. H01L 29/1037
See application file for complete search history.

(56) References Cited

U.S. PATENT DOCUMENTS

| | | | | |
|---|---|---|---|---|
| 8,878,277 | B2 * | 11/2014 | Lee ................... | H01L 29/66833 257/314 |
| 9,006,817 | B2 * | 4/2015 | Choi ................. | H01L 27/11565 257/314 |
| 2011/0057251 | A1 | 3/2011 | Higashi | |
| 2012/0280298 | A1 * | 11/2012 | Park .................... | H01L 29/7926 257/314 |
| 2012/0300547 | A1 * | 11/2012 | Choi ................. | H01L 27/11565 365/185.05 |
| 2013/0153978 | A1 | 6/2013 | Lee et al. | |
| 2014/0043915 | A1 | 2/2014 | Choi | |
| 2015/0017771 | A1 | 1/2015 | Lee et al. | |
| 2015/0048435 | A1 * | 2/2015 | Choi ................. | H01L 27/11565 257/314 |
| 2015/0287739 | A1 * | 10/2015 | Lee ................... | H01L 27/11575 257/326 |

FOREIGN PATENT DOCUMENTS

| | | |
|---|---|---|
| KR | 10-2013-0070922 A | 6/2013 |
| KR | 10-2014-0020628 A | 2/2014 |

\* cited by examiner

*Primary Examiner* — Lex Malsawma (57) ABSTRACT

A three-dimensional (3D) non-volatile semiconductor memory device including a U-shaped channel structure is disclosed. The 3D non-volatile semiconductor memory device includes a pipe gate, an upper pipe channel disposed in the pipe gate at a first depth, a first lower pipe channel disposed in the pipe gate at a second depth different from the first depth, and neighboring the upper pipe channel in a first direction, and a second lower pipe channel disposed in the pipe gate at the second depth, and neighboring the upper pipe channel in a second direction perpendicular to the first direction, wherein the upper pipe channel and the lower pipe channels have the same length.

12 Claims, 10 Drawing Sheets

FIG. 8

THREE-DIMENSIONAL (3D) NON-VOLATILE MEMORY DEVICE

CROSS-REFERENCE TO RELATED APPLICATION

The priority of Korean patent application No. 10-2014-0092140 filed on 21 Jul. 2014, the disclosure of which is hereby incorporated in its entirety by reference, is claimed.

BACKGROUND OF THE INVENTION

Embodiments of the present invention relate to a non-volatile semiconductor memory device, and more particularly to a three-dimensional (3D) non-volatile memory device including a U-shaped channel structure.

A non-volatile memory device is a memory device capable of preserving stored data even when not powered. Various non-volatile memory devices such as flash memories have been widely used.

Since the integration enhancement of a two-dimensional (2D) non-volatile memory device in which a single-layered memory cell is formed over a semiconductor substrate is limited, there has been recently introduced a 3D non-volatile memory device in which memory cells are formed along a channel layer vertically protruding from the semiconductor substrate.

3D non-volatile memory devices are largely classified into a first type of 3D non-volatile memory device having a line-shaped channel layer and a second type of 3D non-volatile memory device having a U-shaped channel layer. A 3D non-volatile memory device having the line-shaped channel layer includes a bit line and a source line respectively formed above and below stacked memory cells. A 3D non-volatile memory device having the U-shaped channel layer includes a bit line and a source line, both of which are disposed over stacked memory cells. The 3D non-volatile memory device having the U-shaped channel layer includes a single-layered selection gate, such that it may have a higher degree of integration than the 3D non-volatile memory device having a line-shaped channel layer.

However, the 3D non-volatile memory device having a U-shaped channel layer is formed by stacking a plurality of small-width word lines, so that the stacked structure of the word lines is susceptible to being tilted. In addition, slits must be formed not only between a source side channel and a drain side channel that construct a single channel, but also between neighboring channels, so that the each of the slits has a narrow width, and an etching process has a high level of difficulty. Moreover, as the integration degree of a semiconductor device gradually increases, the number of stacked word lines also increases, so that the above-mentioned problems become more challenging.

BRIEF SUMMARY OF THE INVENTION

Various embodiments of the present disclosure are directed to providing a three-dimensional (3D) non-volatile memory device that substantially obviates one or more problems due to limitations and disadvantages of the related art.

An embodiment relates to a new three-dimensional (3D) non-volatile semiconductor memory device configured to stably reduce the operation current as well as to increase the degree of integration.

In accordance with an aspect of the present disclosure, the 3D non-volatile semiconductor memory device includes: a pipe gate; an upper pipe channel filled in the pipe gate by a first depth; a first lower pipe channel filled in the pipe gate by a second depth different from the first depth, and arranged contiguous to the upper pipe channel in a first direction; and a second lower pipe channel filled in the pipe gate by the second depth, and arranged contiguous to the upper pipe channel in a second direction perpendicular to the first direction, wherein the upper pipe channel and the lower pipe channel have the same length.

In accordance with another aspect of the present disclosure, A three-dimensional (3D) non-volatile semiconductor memory device includes: a pipe gate; an upper pipe channel array including upper pipe channels that are filled in the pipe gate by a first depth and are arranged at intervals of a predetermined distance; and a lower pipe channel array including lower pipe channels that are disposed between the upper pipe channels, and are filled in the pipe gate by a second depth different from the first depth, wherein the upper pipe channel and the lower pipe channel have the same length.

It is to be understood that both the foregoing general description and the following detailed description of embodiments are exemplary and explanatory.

DESCRIPTION OF EMBODIMENTS

Reference will now be made in detail to certain embodiments, examples which are illustrated in the accompanying drawings. Wherever possible, the same reference numbers will be used throughout the drawings to refer to the same or like parts. In the following description, a detailed description of well-known configurations or functions may be omitted. The embodiments described in the specification and shown in the drawings are purely illustrative and are not intended to represent all aspects of the claims, such that various equivalents and modifications may be made without departing from the spirit of the disclosure.

Figure 1:
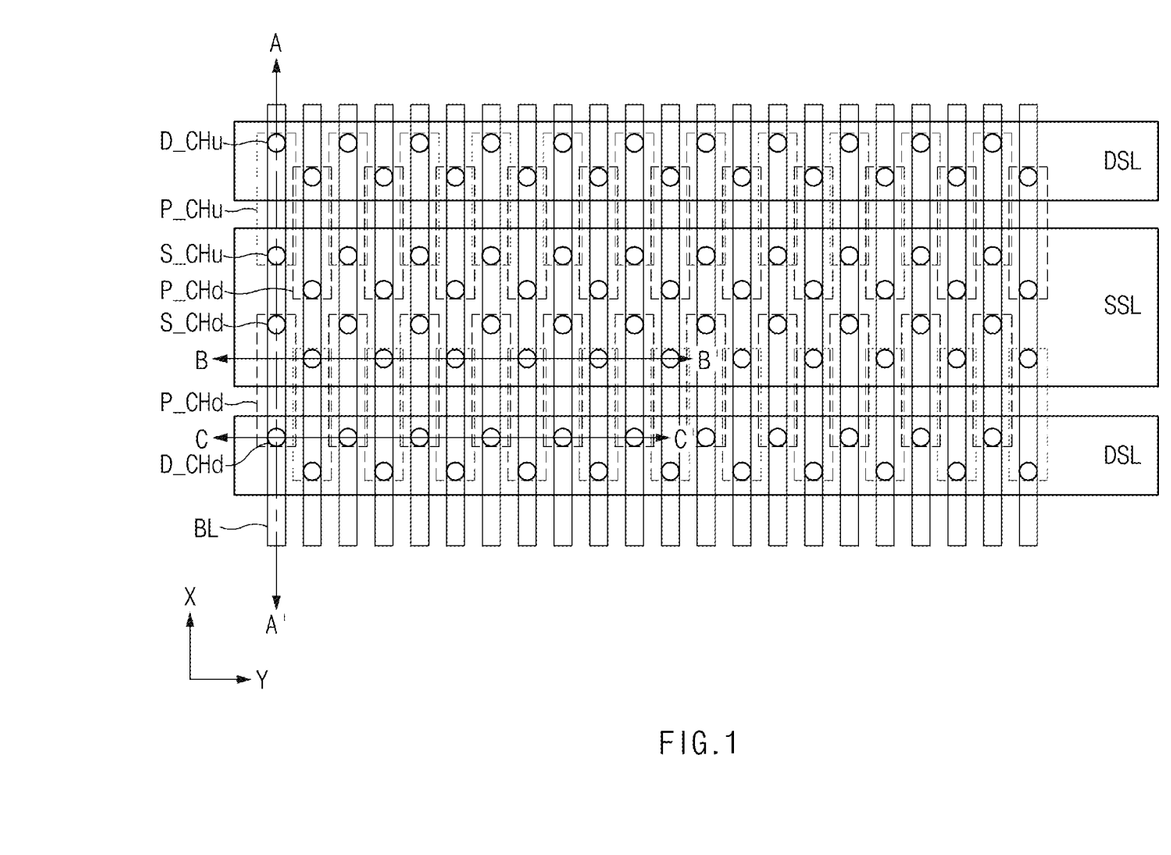
FIG. 1 is a plan view illustrating a non-volatile memory device according to an embodiment.
Figure 2A:
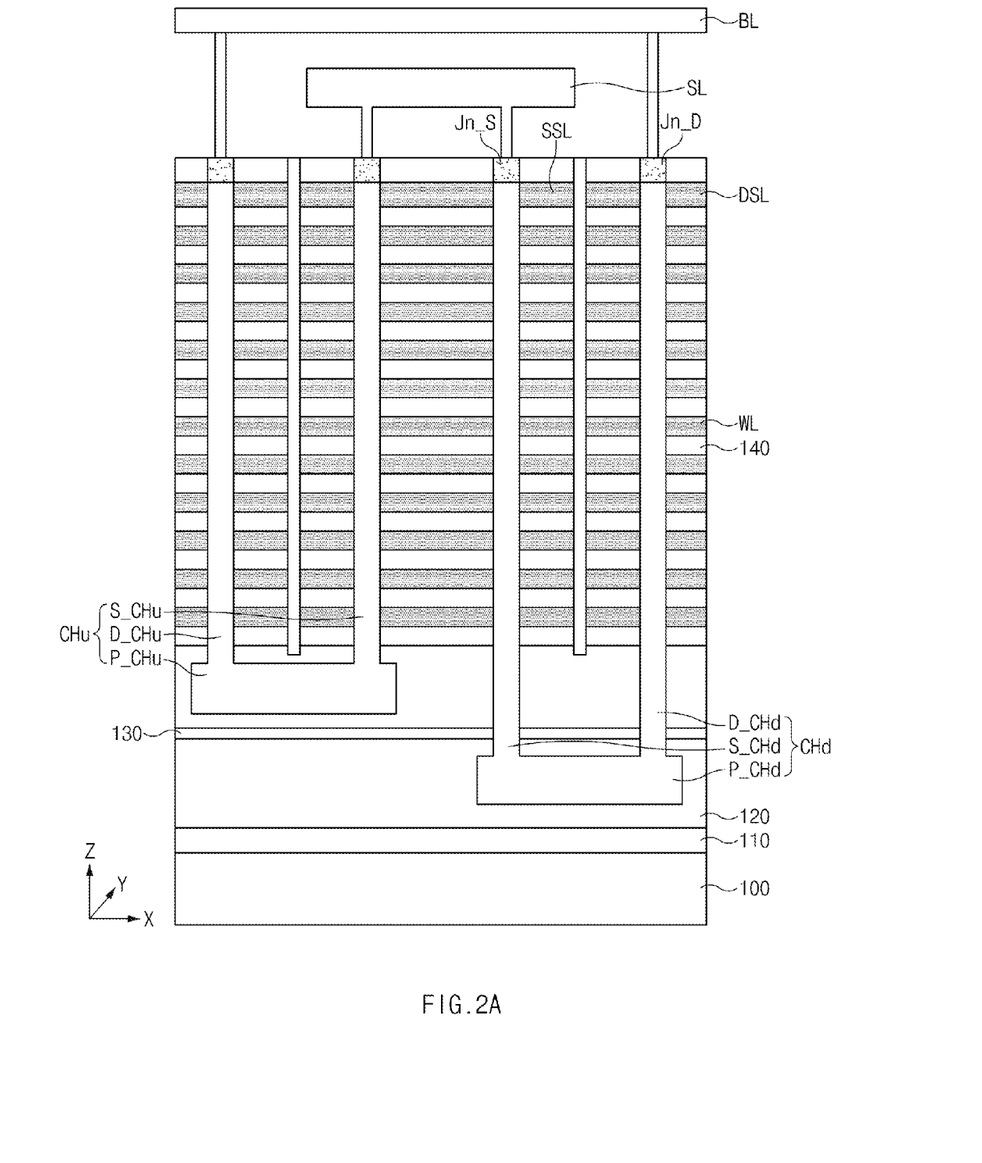
FIG. 2A is a cross-sectional view illustrating the non-volatile memory device taken along the line A-A' of FIG. 1.
Figure 2B:
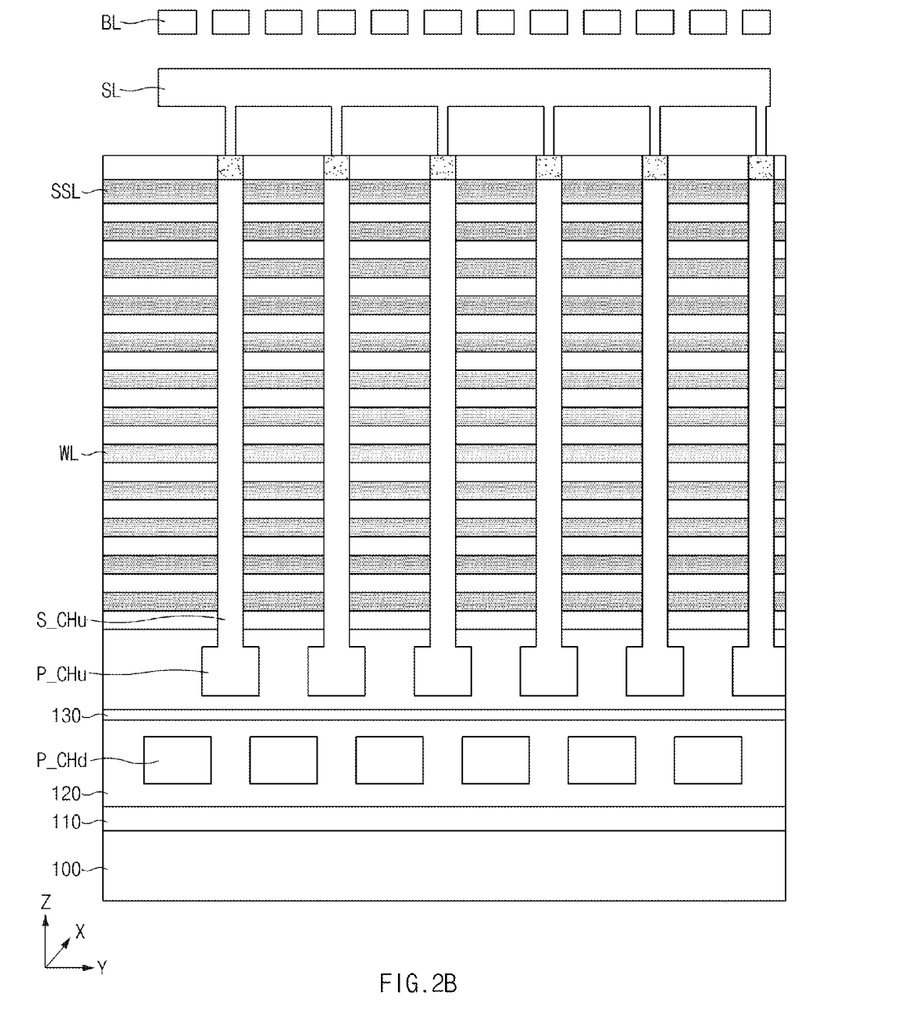
FIG. 2B is a cross-sectional view illustrating the non-volatile memory device taken along the line B-B' of FIG. 1.
Figure 2C:
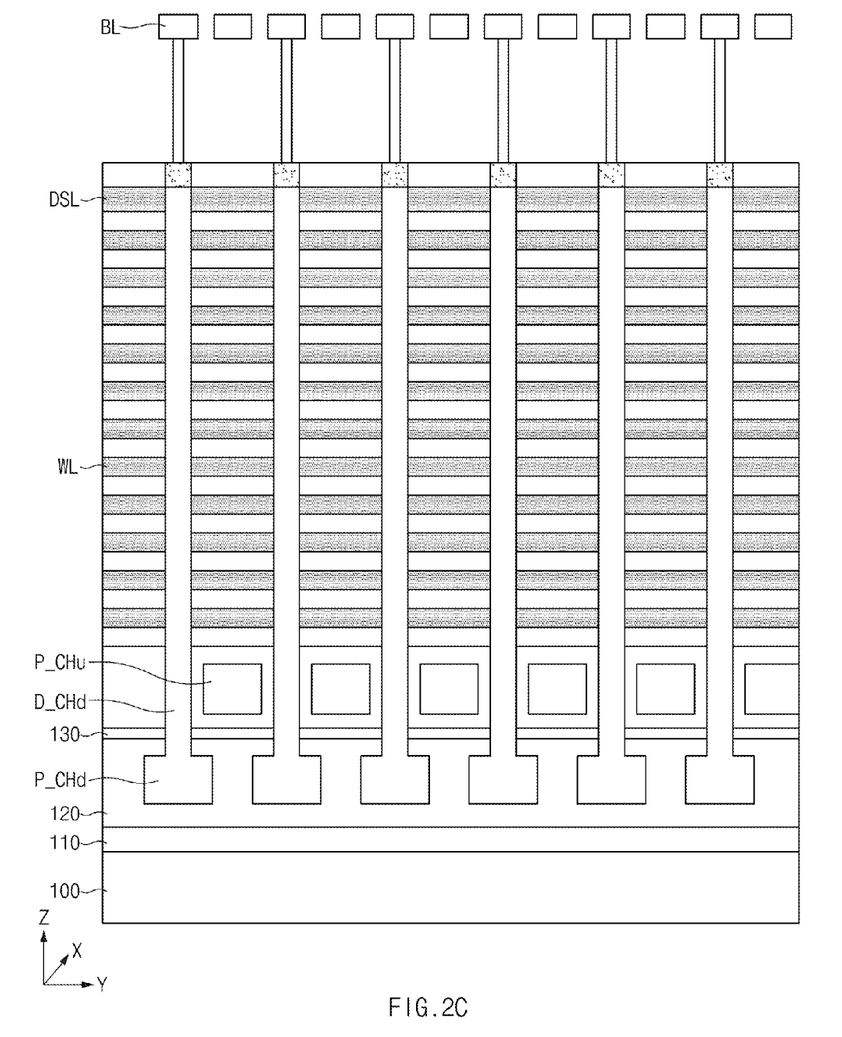
FIG. 2C is a cross-sectional view illustrating the non-volatile memory device taken along the line C-C' of FIG. 1.

FIG. 1 is a plan view illustrating a non-volatile memory device according to an embodiment. FIG. 2A is a cross-sectional view illustrating the non-volatile memory device taken along the line A-A' of FIG. 1. FIG. 2B is a cross-sectional view illustrating the non-volatile memory device taken along the line B-B' of FIG. 1. FIG. 2C is a cross-sectional view illustrating the non-volatile memory device taken along the line C-C' of FIG. 1.

Referring to FIGS. 1 and 2A to 2C, an insulation film 110 is formed over a semiconductor substrate 100, and a pipe gate 120 is formed over the insulation film 110. An upper pipe channel (P_CHu) and a lower pipe channel (P_CHd) are buried in the pipe gate 120. In an embodiment, pipe gate 120 has an upper portion and a lower portion divided by insulation film 130.

The upper pipe channel (P_CHu) and the lower pipe channel (P_CHd) are alternately arranged in a matrix. In other words, neighboring upper pipe channels (P_CHu) are alternately arrayed with lower pipe channels (PCH_d) in both the long-axis direction of source line SL, which is marked as Y in FIG. 1, and the orthogonal long-axis direction of bit lines BL, which is marked as X in FIG. 1. The alternating nature of the array is further illustrated by FIG. 2B and FIG. 2C, which show alternating upper and lower pipe channels in the Y-axis. This arrangement may be referred to as an alternating array. Put another way, the pipe channels are arranged in two columns parallel to the long axis of the source line SL, marked as Y. Each row of the two columns includes a lower pipe channel and an upper pipe channel, and the column positions are reversed for each subsequent row. In an embodiment, the upper pipe channel (P_CHu) is located at a higher level from the substrate 100 than the lower pipe channel (P_CHd). That is, the lower pipe channel (P_CHd) is more deeply buried in the pipe gate 120 than the upper pipe channel (P_CHu). An insulation film 130 may be formed between the upper pipe channel (P_CHu) and the lower pipe channel (P_CHd).

An upper drain side channel (D_CHu) and an upper source side channel (S_CHu) are coupled to both ends of the upper pipe channel (P_CHu), and a lower drain side channel (D_CHd) and a lower source side channel (S_CHd) are coupled to opposing ends of the lower pipe channel (P_CHd). That is, the upper pipe channel (P_CHu), the upper drain side channel (D_CHu), and the upper source side channel (S_CHu) may form a single upper U-shaped channel (CHu), and the lower pipe channel (P_CHd), the lower drain side channel (D_CHd), and the lower source side channel (S_CHd) may form a single lower U-shaped channel (CHd).

The upper drain side channel (D_CHu) and the lower drain side channel (D_CHd) may be selectively coupled to the bit line (BL) by a drain selection line (DSL). The upper source side channel (S_CHu) and the lower source side channel (S_CHd) may be selectively coupled to the source line (SL) by a source selection line (SSL). A surface of an outer wall of the drain side channels (D_CHu, D_CHd) and the source side channel (S_CHu, S_CHd) may be enclosed by a multi-layered film in which a tunnel insulation film, a charge trap film (not shown), and a charge blocking film (not shown) are stacked.

Specifically, the upper pipe channels (P_CHu) alternately arranged along a long-axis direction of the source line (SL) may have substantially the same channel length as the lower pipe channels (P_CHd), and some regions of the upper pipe channels (P_CHu) may overlap with those of the lower pipe channels (P_CHd). The long-axis direction of source line SL is marked as the Y axis in FIG. 1. As seen in the figures, the center parts of the upper pipe channels (P_CHu) and the lower pipe channels (P_CHd) arranged in a direction along a Y-axis are not arranged in a line along the Y-axis direction.

As described above, pipe channels (P_CHu, P_CHd) are formed in a double-layered structure so that the upper and lower pipe channels (P_CHu, P_CHd) have the same length. In such an embodiment, a lower operation current is consumed compared to a device in which neighboring pipe channels have different lengths.

A plurality of multi-layered word lines (WL), which may be gates, are formed over the pipe gate 120 and spaced apart from one another by a predetermined distance by layers of the insulation film 140 interposed therebetween. The word lines (WL) are formed of conductive films, and have an elongated shape extending in a line. Such a structure may be referred to as a line-shaped word line. The word lines (WL) enclose the drain side channels (D_CHu, D_CHd) and the source side channels (S_CHu, S_CHd).

A selection line (SSL or DSL) is formed over multi-layered word lines WL. The multi-layered word lines WL and the selection lines SSL and DSL are separated by the insulation film 140. The selection line (SSL or DSL) may be formed of a conductive film, and extend in a line shape parallel to the word lines WL, which is indicated as the Y direction in the figures. The source selection line (SSL) may enclose the source side channels (S_CHu, S_CHd), and the drain selection line (DSL) may enclose the drain side channels (D_CHu, D_CHd). Outer wall surfaces of the drain side channels (D_CHu, D_CHd) and the source side channels (S_CHu, S_CHd), which cross a selection line SSL or DSL, are enclosed by a gate insulation film (not shown). That is, the gate insulation film (not shown) is interposed between the selection line (SSL or DSL) and the side channels (D_CHu, D_CHd, S_CHu, S_CHd). A selection transistor is defined at an intersection region between the selection line (SSL or DSL) and the side channels (D_CHu, D_CHd, S_CHu, S_CHd).

A material film for a junction is disposed in an upper end region of the side channels (D_CHu, D_CHd, S_CHu, S_CHd). This junction material film may include a doped polysilicon film.

A source line (SL) and a bit line (BL) are formed over an upper U-shaped channel (CHu) and a lower U-shaped channel (CHd). The source line (SL) extends in a Y-direction parallel to the word lines (WL), and the bit line (BL) extends in a X-direction orthogonal to the source line (SL).

FIGS. 3 to 8 are cross-sectional views illustrating a method for forming a non-volatile memory device according to an embodiment. A method for forming the non-volatile memory device according to an embodiment will hereinafter be described with reference to the perspective of FIG. 2A.

Figure 3:
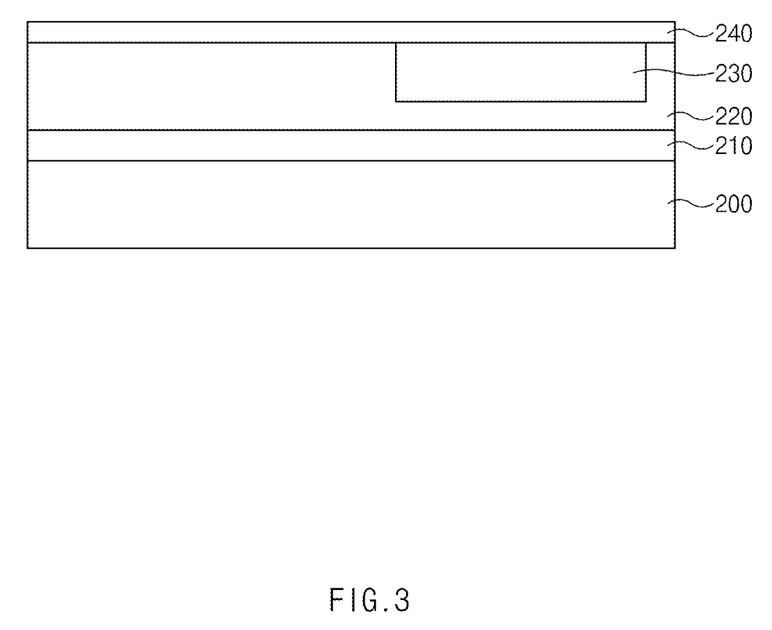
FIGS. 3 to 8 are cross-sectional views illustrating a method for forming the non-volatile memory device according to an embodiment.

Referring to FIG. 3, an insulation film 210 is formed over a substrate 200, and a first pipe gate electrode layer 220 is formed over the insulation film 210. In an embodiment, the substrate 200 is a semiconductor substrate including monocrystalline silicon, and may include a predetermined underlying structure (not shown). The first pipe gate electrode layer 220 may be formed of a conductive material such as doped polysilicon or metal.

Subsequently, the first pipe gate electrode layer 220 is selectively etched to form a lower pipe channel trench, and a sacrificial insulation film 230 is formed to fill the lower pipe channel trench. In an embodiment, a plurality of sacrificial insulation films 230 are arranged in an alternating grid pattern with respect to a plan view, and each separate portion may have a rectangular island shape as shown in the lower pipe channel (P_CHd) of FIG. 1. The sacrificial insulation films 230 may be alternately arranged in a zigzag pattern along the array. The sacrificial insulation films 230 may include a nitride film.

Subsequently, a second pipe gate electrode layer 240 is formed over the first pipe gate electrode 220 and the sacrificial insulation film 230. The first and second pipe gate electrode layers (220, 240) may enclose the sacrificial insulation film 230. In an embodiment, the second pipe gate electrode layer 240 may be formed of the same conductive material as the first pipe gate electrode layer 240. For example, the second pipe gate electrode layer 240 may be formed of doped polysilicon or metal.

Figure 4:
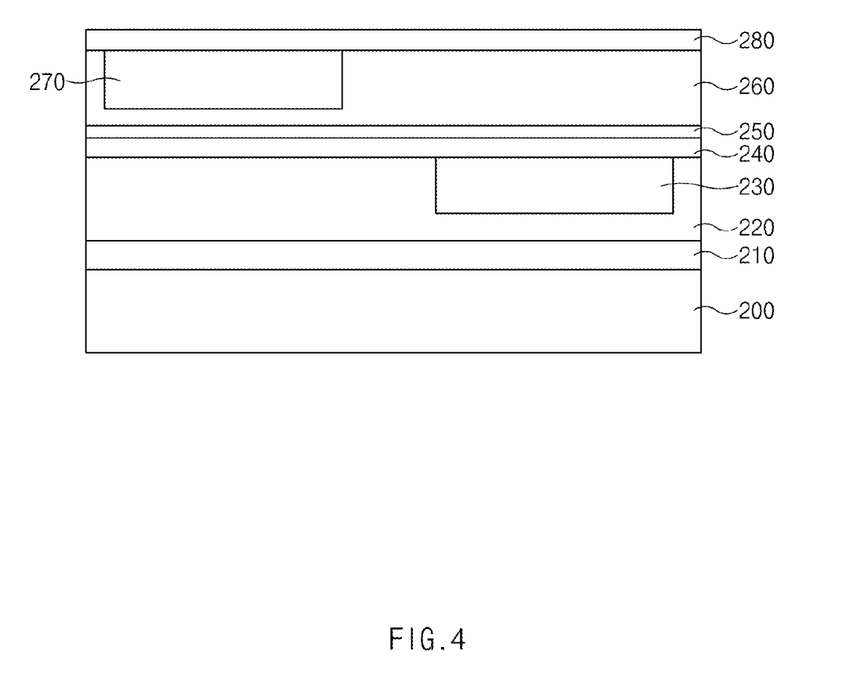

Referring to FIG. 4, an insulation film 250 is formed over the second pipe gate electrode layer 240, and a third pipe gate electrode layer 260 is formed over the insulation film 250. In an embodiment in which the insulation film 250 is not formed, a third pipe gate electrode 260 may be formed directly over the first pipe gate electrode 220 and the sacrificial insulation film 230.

Thereafter, a trench for the upper pipe channel is formed by selectively etching the third pipe gate electrode layer 260, and a sacrificial insulation film 270 is formed to fill the upper pipe channel trench. In an embodiment, the sacrificial insulation films (230, 270) of the upper pipe channel (P_CHu) have the same size, and particularly the same length, as the sacrificial insulation films of the lower pipe channel (P_CHd), and portions of the sacrificial insulation films (230, 270) overlap with each other. In addition, the center parts of the sacrificial insulation films (230, 270) arranged in a Y-axis direction are not arranged in a line. That is, the sacrificial insulation films (230, 270) are arranged in a zigzag pattern along the Y-axis of the figures instead or being in a line. The sacrificial insulation films (230, 270) may be formed of the same material.

Subsequently, a fourth pipe gate electrode layer 280 is formed over the third gate electrode layer 260 and the sacrificial insulation film 270. The third and fourth pipe gate electrode layers (260, 280) may enclose the sacrificial insulation film 270, and may have the same materials.

Figure 5:
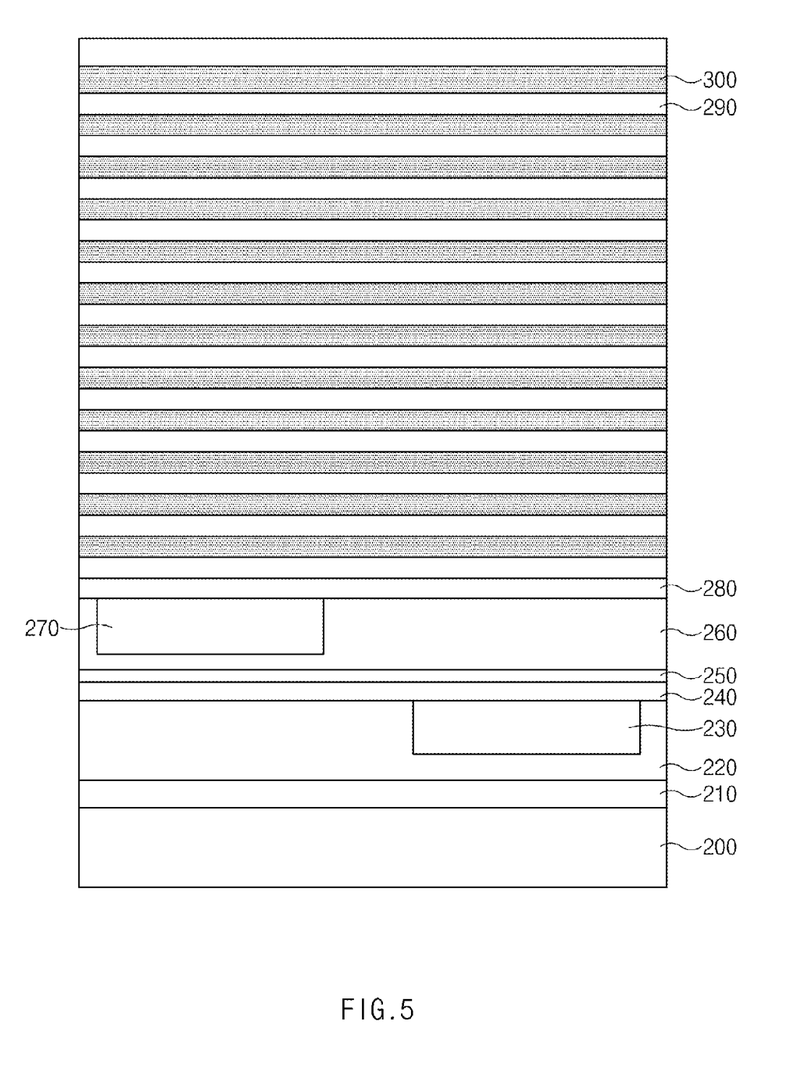

Referring to FIG. 5, an insulation film 290 and a conductive film 300 are alternatively stacked over the fourth pipe gate electrode layer 280. The conductive film 300 may form word lines, a drain selection line (DSL), or a source selection line (SSL) in a subsequent process. The insulation film 290 may be an interlayer insulation film for insulating stacked word lines and the drain and source selection lines (DSL, SSL) from one another. Therefore, the number of stacked insulation films 290 and the number of stacked conductive films 300 are determined according to the number of memory cells to be stacked, the number of drain selection gates to be stacked, and the number of source selection gates to be stacked.

Figure 6:
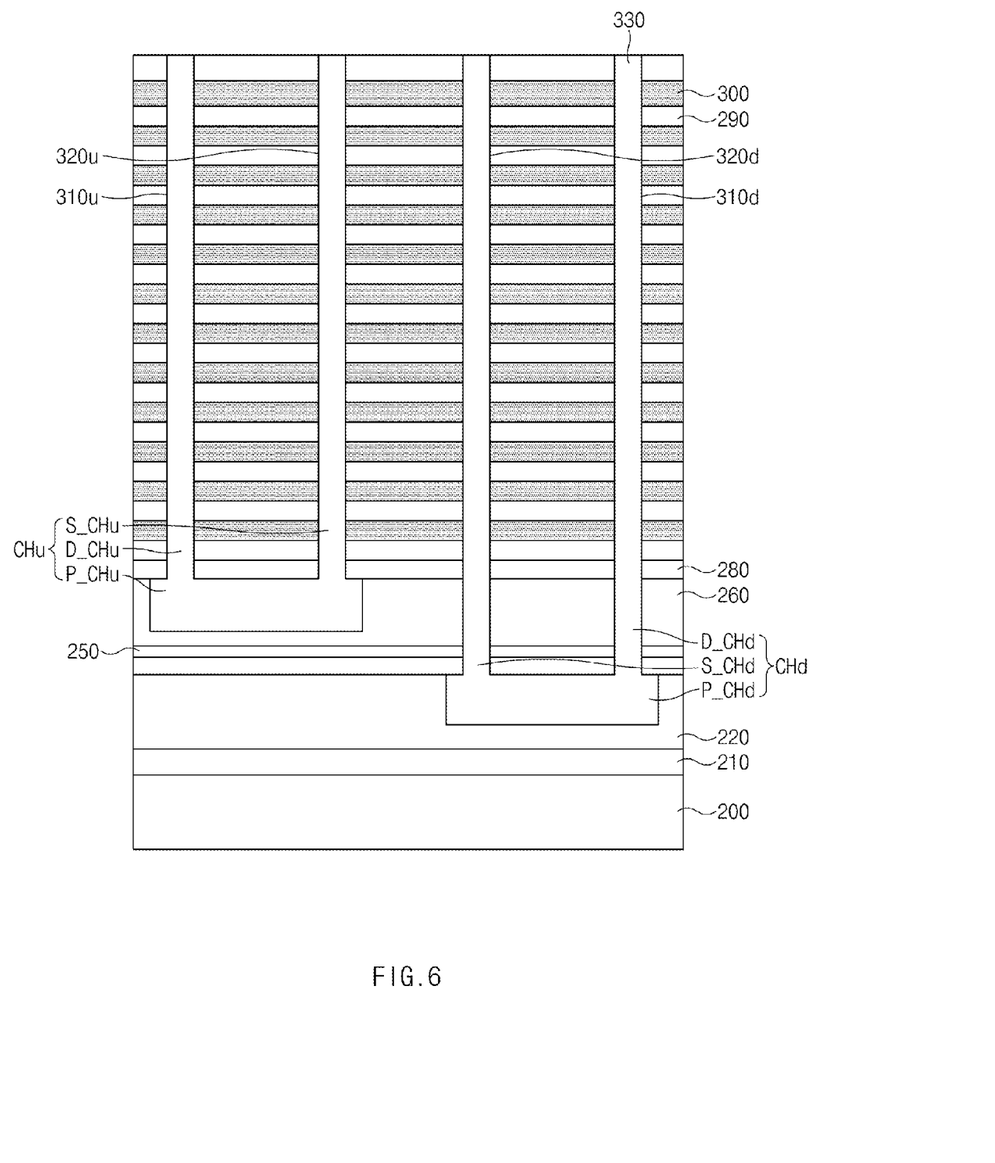

Referring to FIG. 6, the insulation film 250 and the conductive film 260 are etched to expose the sacrificial insulation films (230, 270), so that one pair of source side channel holes (310u, 310d) and one pair of drain side channel holes (320u, 320d) contact each upper pipe channel trench and each lower pipe channel trench. In an embodiment, the holes (310d, 320d) coupled to the lower pipe channel trench may be formed more deeply than the holes (310u, 320u) coupled to the upper pipe channel trench. The side channel holes (310u, 320u) coupled to the upper pipe channel trench and the side channel holes (310d, 320d) coupled to the lower pipe channel trench may be formed simultaneously or by different techniques.

Subsequently, the sacrificial insulation films (230, 270) are removed through the side channel holes (310u, 320u, 310d, 320d). As a result, the side channel holes (310u, 320u) and the upper pipe channel trench may form an upper U-shaped trench. The side channel holes (310d, 320d) and the lower pipe channel trench may form a lower U-shaped trench. In an embodiment, a tunnel insulation film may be formed for charge tunneling, and may include, for example, an oxide film. a charge trap film may be formed to store data by trapping charges, and may include, for example, a nitride film. A charge blocking film may be formed to prevent charges of the charge trap film from conducting to exterior structures. In an embodiment, the charge blocking film may include an oxide film having a higher dielectric constant (higher permittivity) than the charge trap film. In addition, the channel layer 330 may include a part used as a channel of a memory cell or a selection transistor and a part used as a channel of a pipe transistor. The channel layer 330 may be formed of a semiconductor material such as polysilicon.

Consequently, the upper U-shaped channel (CHu), which includes the upper pipe channel (P_CHu), the upper drain side channel (D_CHu), and the upper source side channel (S_CHu), is formed. The lower U-shaped channel (CHd), which includes the lower pipe channel (P_CHd), the lower drain side channel (D_CHd), and the lower source side channel (S_CHd), is formed.

Figure 7:
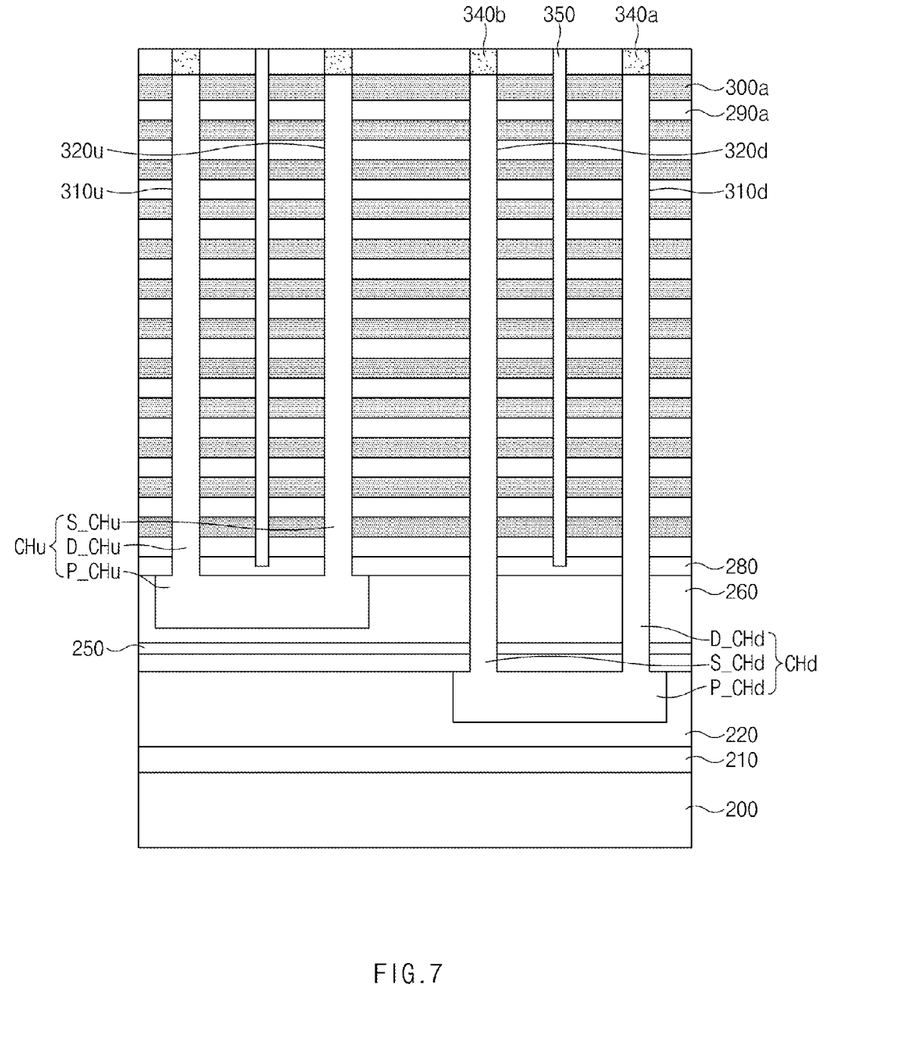

Referring to FIG. 7, upper parts of the upper U-shaped channel (CHu) and the lower U-shaped channel (CHd) are partially removed and filled with a junction material, resulting in junctions (340a, 340b) at ends of the U-shaped channel. In an embodiment, the junction material may include doped polysilicon. The junctions (340a, 340b) include a drain junction 340a of a drain selection transistor and a source junction 340b of a source selection transistor.

Thereafter, portions of the insulation film 290 and the conductive film 300 which are disposed between the drain side channels (D_CHu, D_CHd) and the source side channels (S_CHu, S_CHd) are etched until the fourth pipe gate electrode layer 280 is exposed, so that a trench (not shown) for device isolation is formed to separate the source and drain regions. This device isolation trench is formed as a high aspect ratio slit extending in the Y-direction of FIG. 1. Therefore, a gate electrode (word line) 300a encloses the drain side channels (D_CHu, D_CHd) and the source side channels (S_CHu, S_CHd) is formed The gate electrode 300a extends in the Y-direction of FIG. 1, and an insulation film pattern 290a separates stacked gate electrodes 300a. The gate electrode 300a may include the source selection line SSL and the drain selection line DSL. That is, the uppermost gate electrode from among the gate electrodes 300a may be used for the selection lines (SSL, DSL).

Subsequently, the device isolation trench is filled with insulation film 350. The insulation film 350 may include an oxide film or a nitride film.

Figure 8:
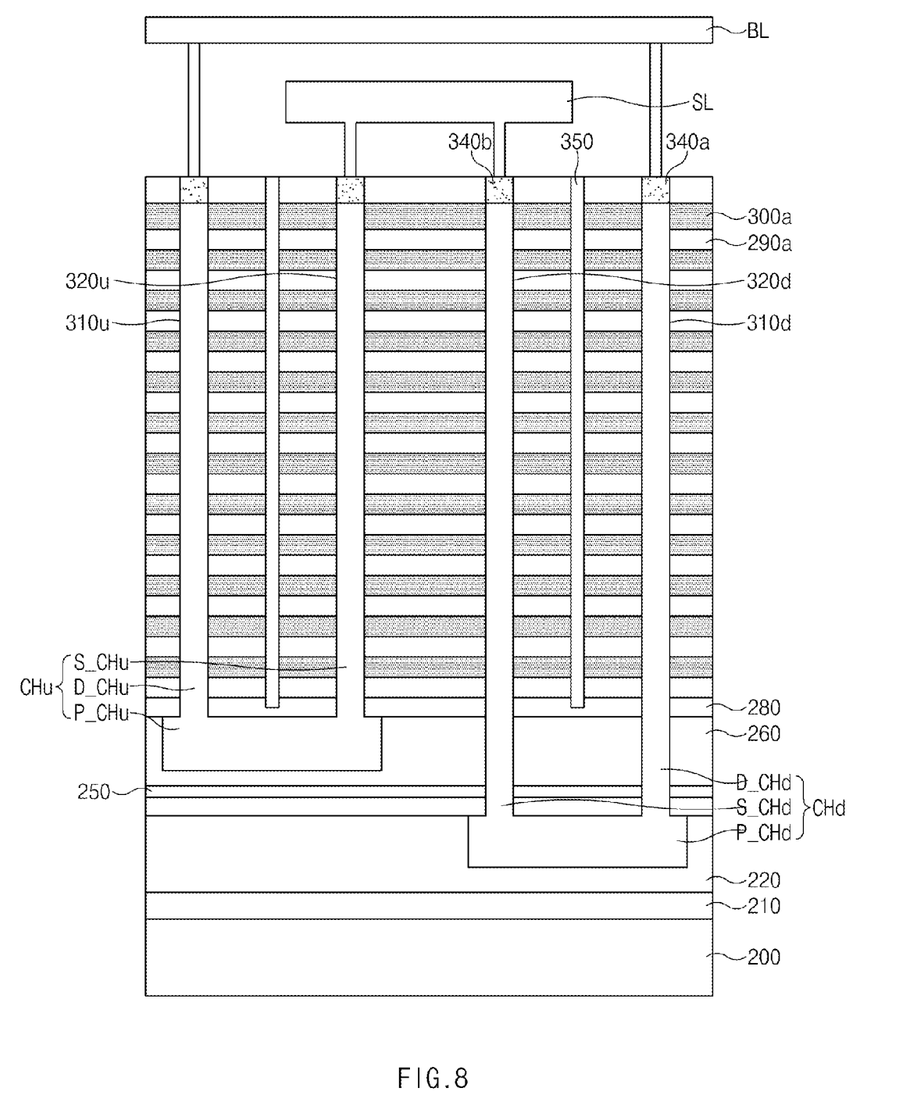

Referring to FIG. 8, a line-shaped source line (SL) is commonly coupled to a source junction 340b of the upper U-shaped channel (CHu) and a source junction 340b of the lower U-shaped channel (CHd).

Subsequently, bit lines (BL) are commonly coupled to a drain junction 340a of the upper U-shaped channel (CHu) and a drain junction 340a of the lower U-shaped channel (CHd).

As is apparent from the above description, embodiments of the present disclosure can increase the degree of integration of a three-dimensional (3D) non-volatile semiconductor device, and can also improve operation characteristics of a semiconductor device.

Those skilled in the art will appreciate that embodiments of the present disclosure may be carried out in other ways than those set forth herein without departing from the spirit and characteristics of these embodiments. The above embodiments are therefore to be construed in all aspects as illustrative and not restrictive.

The above embodiments of the present disclosure are illustrative and not limitative. Various alternatives and equivalents are possible. Embodiments are not limited by the type of deposition, etching polishing, and patterning steps described herein. Nor are embodiments limited to any specific type of semiconductor devices. For example, embodiments may be implemented in a volatile memory device, such as a dynamic random access memory (DRAM) device, or a non-volatile memory device. Other additions, subtractions, or modifications are obvious in view of the present disclosure and are intended to fall within the scope of the appended claims.

What is claimed is:
1. A three-dimensional (3D) non-volatile semiconductor memory device comprising:
   a pipe gate;
   an upper pipe channel disposed in the pipe gate at a first depth;

a first lower pipe channel disposed in the pipe gate at a second depth different from the first depth, and neighboring the upper pipe channel in a first direction; and a second lower pipe channel disposed in the pipe gate at the second depth, and neighboring the upper pipe channel in a second direction perpendicular to the first direction, wherein the upper pipe channel and the first and second lower pipe channels have the same length.

2. The three-dimensional (3D) non-volatile semiconductor memory device according to claim 1, wherein a portion of the upper pipe channel overlaps with a portion of the first lower pipe channel.

3. The three-dimensional (3D) non-volatile semiconductor memory device according to claim 1, wherein a center part of the upper pipe channel and a center part of the first lower pipe channel are not arranged in a line along the first direction.

4. The three-dimensional (3D) non-volatile semiconductor memory device according to claim 1, further comprising:
- an upper drain side channel coupled to the upper pipe channel, and enclosed by a first drain selection line;
- an upper source side channel coupled to the upper pipe channel, and enclosed by a source selection line;
- a first lower drain side channel coupled to the first lower pipe channel, and enclosed by the first drain selection line;
- a first lower source side channel coupled to the first lower pipe channel, and enclosed by the source selection line;
- a second lower drain side channel coupled to the second lower pipe channel, and enclosed by a second drain selection line; and
- a second lower source side channel coupled to the second lower pipe channel, and enclosed by the source selection line.

5. The three-dimensional (3D) non-volatile semiconductor memory device according to claim 4, further comprising:
- a first bit line commonly coupled to the upper drain side channel and the second lower drain side channel;
- a second bit line coupled to the first lower drain side channel; and
- a line-type source line commonly coupled to the upper source side channel, the first lower source side channel, and the second lower source side channel.

6. The three-dimensional (3D) non-volatile semiconductor memory device according to claim 1, further comprising:
an insulation film disposed between the upper pipe channel and the first and second lower pipe channels.

7. A three-dimensional (3D) non-volatile semiconductor memory device comprising:
- a pipe gate;
- an upper pipe channel array including upper pipe channels disposed in the pipe gate at a first depth and arranged at intervals of a predetermined distance; and
- a lower pipe channel array including lower pipe channels that are disposed in spaces between the upper pipe channels, and are disposed in the pipe gate at a second depth different from the first depth,
wherein the upper pipe channels and the lower pipe channels have the same length.

8. The three-dimensional (3D) non-volatile semiconductor memory device according to claim 7, wherein portions of the upper pipe channels overlap with portions of the lower pipe channels.

9. The three-dimensional (3D) non-volatile semiconductor memory device according to claim 7, wherein the upper pipe channels and the lower pipe channels are arranged in an alternating array.

10. The three-dimensional (3D) non-volatile semiconductor memory device according to claim 7, further comprising:
- a plurality of upper channel pairs, each of which includes an upper drain side channel and an upper source side channel coupled to each upper pipe channel; and
- a plurality of lower side channel pairs, each of which includes a lower drain side channel and a lower source side channel coupled to each lower pipe channel.

11. The three-dimensional (3D) non-volatile semiconductor memory device according to claim 10, further comprising:
- a plurality of bit lines respectively coupled to each upper drain side channel and each lower drain side channel; and
- a source line commonly coupled to each upper source side channel and each lower source side channels.

12. The three-dimensional (3D) non-volatile semiconductor memory device according to claim 7, further comprising:
an insulation film disposed between the upper pipe channel array and the lower pipe channel array.

* * * * *